(12) United States Patent
Innocent

(10) Patent No.: US 7,977,717 B1
(45) Date of Patent: Jul. 12, 2011

(54) PIXEL SENSING CIRCUIT

(75) Inventor: Manuel Innocent, Wezemaal (BE)

(73) Assignee: ON Semiconductor Trading, Ltd, Hamilton (BM)

( * ) Notice: Subject to any disclaimer, the term of this patent is extended or adjusted under 35 U.S.C. 154(b) by 173 days.

(21) Appl. No.: 12/413,557

(22) Filed: Mar. 28, 2009

Related U.S. Application Data

(60) Provisional application No. 61/155,473, filed on Feb. 25, 2009.

(51) Int. Cl.
*H01L 31/062* (2006.01)
(52) U.S. Cl. ............... 257/292; 257/401; 257/E27.132
(58) Field of Classification Search .............. 257/292, 257/401, E27.132, E27.133
See application file for complete search history.

(56) References Cited

U.S. PATENT DOCUMENTS

| | | | |
|---|---|---|---|
| 5,625,210 A | 4/1997 | Lee et al. | |
| 6,690,074 B1 | 2/2004 | Dierickx et al. | |
| 2008/0258187 A1* | 10/2008 | Ladd et al. | 257/292 |

OTHER PUBLICATIONS

U.S. Appl. No. 61/155,473: Innocent, Manuel "Low Leakage Pinned Photo Diode Using Ring Transfer Gate;" filed Feb. 25, 2009; 51 pages.
Hughes et al. "Radiation effects and hardening of MOS technology: devices and circuits;" IEEE Transactions on Nuclear Science; Jun. 2003; <http://ieeexplore.ieee.org/stamp>; 22 pages.
Mavis et al. "Employing radiation hardness by design techniques with commercial integrated circuit process;" in Proc. Digital Avionics System Conference (16th DASC, AIAA/IEEE); 1997; 8 pages.
Bogaerts et al. "Total Dose and displacement damage effects in a radiation-hardened CMOS APS;" IEEE Transactions on Electron Devices; Jan. 2003; <http://ieeexplore.ieee.org/stamp>; 7 pages.
Lee et al. "Active pixel sensor integrated with a pinned photodiode;" U.S. Patent 5,625,210; Apr. 29, 1997; 9 pages.

* cited by examiner

*Primary Examiner* — Mark Prenty

(57) ABSTRACT

Systems and methods of pixel sensing circuits. In accordance with a first embodiment of the present invention, a pixel sensing circuit includes a floating diffusion functionally coupled to and surrounded by a ring transfer gate. The ring transfer gate is functionally coupled to and surrounded by a photo diode. The photo diode may be surrounded by a region of poly silicon. The disclosed structure provides radiation hardening and low light performance.

18 Claims, 6 Drawing Sheets

PIXEL SENSING CIRCUIT

RELATED CASE

This Application claims benefit to U.S. Provisional Application 61/155,473, EFS ID 4860207, filed Feb. 25, 2009, entitled "Low Leakage Pinned Photo Diode Using Ring Transfer Gate" to Innocent.

TECHNICAL FIELD

Embodiments of the present invention relate to the field of electronic image sensors.

BACKGROUND

Complementary Metal Oxide Semiconductor (CMOS) image sensors generally offer advantages in the areas of integration, power consumption/dissipation and total system size in comparison to charge coupled device (CCD) image sensors. CMOS image sensors have come to dominate the image sensor marketplace for numerous applications, including, for example, camera phones, security cameras, PC video capture, bar-code scanners, fax machines, desk-top scanners, toys, biometric devices and the like.

An image sensor, including CMOS image sensors, has "dark current." Dark current is generally a signal level from an image sensor when the image sensor is not exposed to light, e.g., it is in darkness. Dark current is analogous to a noise floor for an image sensor. In general, the lower the dark current, the better an image sensor performs, especially in low light conditions.

Some applications for image sensors, e.g., for military and/or satellite use, specify increased radiation hardness. For example, protons and gamma rays in the space environment can rapidly degrade an image sensor.

BRIEF DESCRIPTION OF THE DRAWINGS

Unless otherwise noted, the drawings are not drawn to scale.

DETAILED DESCRIPTION

Figure 1:
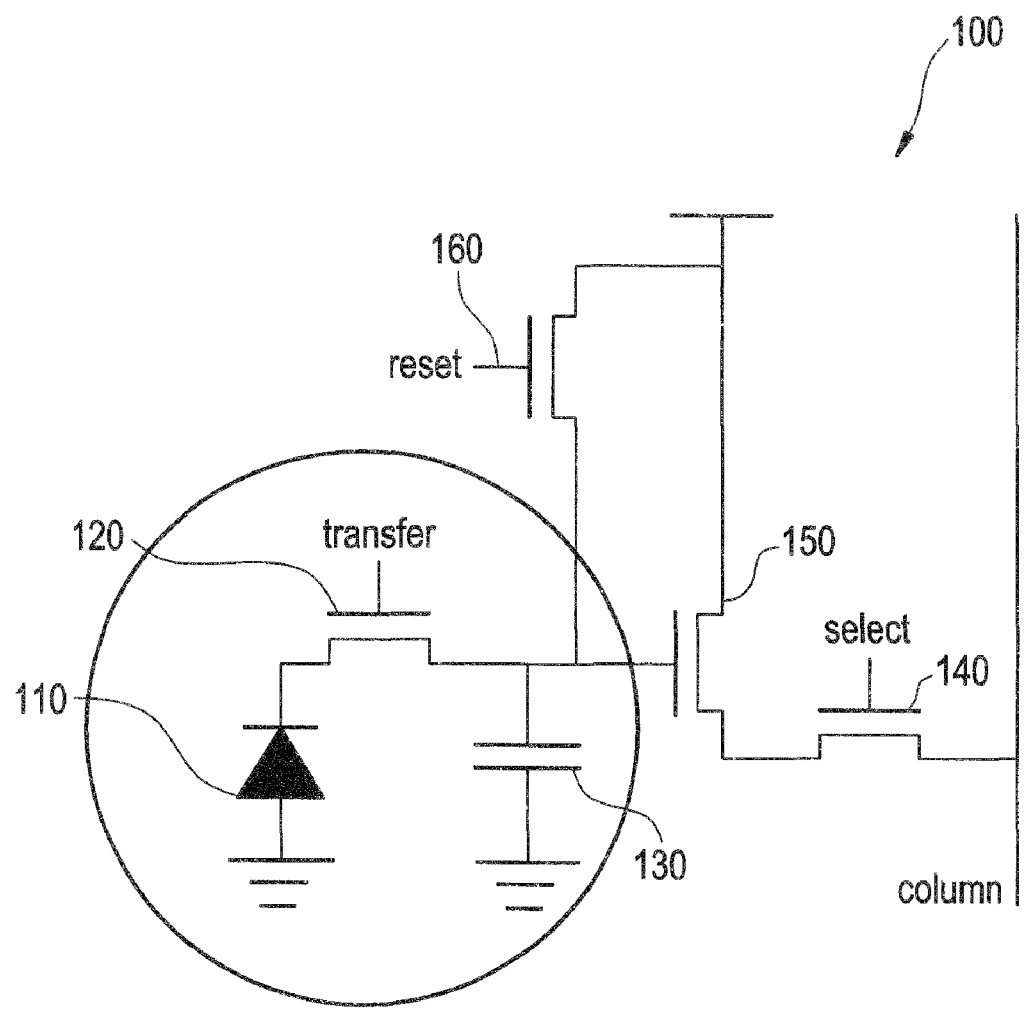
FIG. 1 illustrates a schematic of an embodiment of a pixel sensing circuit, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents. Furthermore, in the following detailed description, numerous specific details are set forth in order to provide a thorough understanding of the disclosure. However, it will be recognized by one of ordinary skill in the art that the disclosed embodiments may be practiced without these specific details. In other instances, well known methods, procedures, components, and circuits have not been described in detail as not to unnecessarily obscure aspects of the invention.

NOTATION AND NOMENCLATURE

As used in the preset application, the terms "pixel" or "pixel sensing circuit" are used interchangeably to describe or refer to the smallest unit of light sensitive circuit of an image sensing device or pixel array. For example, a pixel generally includes one light sensitive element, e.g., a photo diode, and associated circuitry for managing that light sensitive element and its output. In the electronic image sensing arts, image sensing devices generally comprise multiple pixels, e.g., organized into an array of pixels, and are generally described in terms of their resolution in pixels. For example, the "LUPA13002" image sensing device, commercially available from Cypress Semiconductor Corporation of San Jose, Calif., may comprise an array of 1280×1024 individual active pixels, for a total of 1,310,720 individual pixels. Individual pixels or pixel sensing circuits are frequently described in terms of the number of transistors per each photo-sensitive element. For example, a "4T" pixel generally comprises four transistors per pixel.

Embodiments of image sensors specify both radiation hardening and very low dark current. For example, star trackers are image sensors utilized on satellites and deep space craft that track stars for navigation and/or orientation purposes. Since these image sensors are in space, a radiation hardened design is optimal. In addition, since they are generally aimed at relatively faint stars, star tracking sensors specify very high levels of low light performance, and hence specify very low dark current.

Embodiments of systems and methods include low leakage pinned photodiodes using ring transfer gates. In addition, systems and methods of image sensors with photo diodes surrounding transfer gates are disclosed in embodiments herein. Embodiments described herein may be compatible and complimentary with existing systems and methods of semiconductor image sensor manufacturing and operation.

Systems and methods of low leakage pinned photodiodes using ring transfer gates may be disclosed in embodiments herein. In accordance with a first embodiment of the present invention, a pixel sensing circuit includes a charge storage element functionally coupled to and surrounded by a photo diode. The charge storage element may include a floating diffusion, and the charge storage element may further include a transfer gate transistor for coupling the floating diffusion to the photo diode.

In accordance with an embodiment of the present invention, a pixel sensing circuit includes a transfer gate transistor functionally coupled to and surrounded by a photo diode. The transfer gate transistor may include an enclosed geometry MOSFET.

In accordance with an embodiment of the present invention, a pixel sensing circuit includes a floating diffusion functionally coupled to and surrounded by a ring transfer gate. The ring transfer gate is functionally coupled to and surrounded by a photo diode. The photo diode may be surrounded by a region of poly silicon.

FIG. 1 illustrates a schematic of an embodiment of a pixel sensing circuit 100, in accordance with embodiments of the present invention. Pixel 100 is a four transistor, or "4T," pixel. It is appreciated that embodiments in accordance with the present invention are well suited to other pixel architectures, including, for example, "shared" 4T pixels, e.g., a pixel that share one or more nodes with another pixel, and 5T pixels.

Pixel 100 comprises a photo diode 110, which may be a "pinned" or buried photo diode. The photo diode 110 collects electrons generated by photons interacting with the silicon. Transfer gate transistor 120 transfers that charge to capacitance 130, when closed. Capacitance 130 may be formed by a floating diffusion. The floating diffusion 130 serves as an analog storage element for charge from photo diode 110 and the capacitance 130 converts the collected charge into a voltage.

Pixel 100 comprises four transistors in an embodiment. Pixel reset transistor 160 functions to bring floating diffusion 130 to a predetermined potential, known as the reset level. Transfer gate 120 transfers charge from the photo diode 110 to the floating diffusion 130. A combination of closing reset transistor 160 and transfer gate 120, overlapping or non-overlapping, drains charge out of photo diode 110, e.g., to "reset" photo diode 110. When reset transistor 160 is open and transfer gate 120 is closed, all charge from the photo diode 110 is transferred to floating diffusion 130, stored on the floating diffusion and converted into a voltage by the capacitance of 130. Source follower transistor 150 is an amplifier that generally serves as a buffer to read the voltage on floating diffusion 130. A select transistor 140 serves to couple the output voltage of the source follower 150 to a column line.

In general, transfer gate transistor 120 receives clocked control signals to control the flow of charge out of photo diode 110. The charge is generally the result of interaction between light energy and photo diode 110. In typical operation, reset transistor 160 and transfer gate transistor 120 will close together to drain charge from floating diffusion 130 and the photo diode 110. Transfer gate transistor 120 will open again. This is the beginning of the integration portion of the cycle. Reset transistor 160 may be either open or closed during integration. Reset transistor 160 then closes again and opens again to reset floating diffusion 130 to the reset level at the beginning of the readout operation. The reset level voltage is read through source follower 170 and select transistor 140 to the column. Then transfer gate transistor 120 closes to allow charge from photo diode 110 to charge floating diffusion 130. Transfer gate transistor 120 opens to end the integration portion of the cycle. The charge is stored on the floating diffusion and converted into a voltage by the capacitance of 130. This is the signal level. The signal level voltage is read through source follower 150 and select transistor 140 to the column. Typically, the reset voltage is subtracted from the signal voltage external to the pixel. This subtraction eliminates the noise on the reset level.

Figure 2:
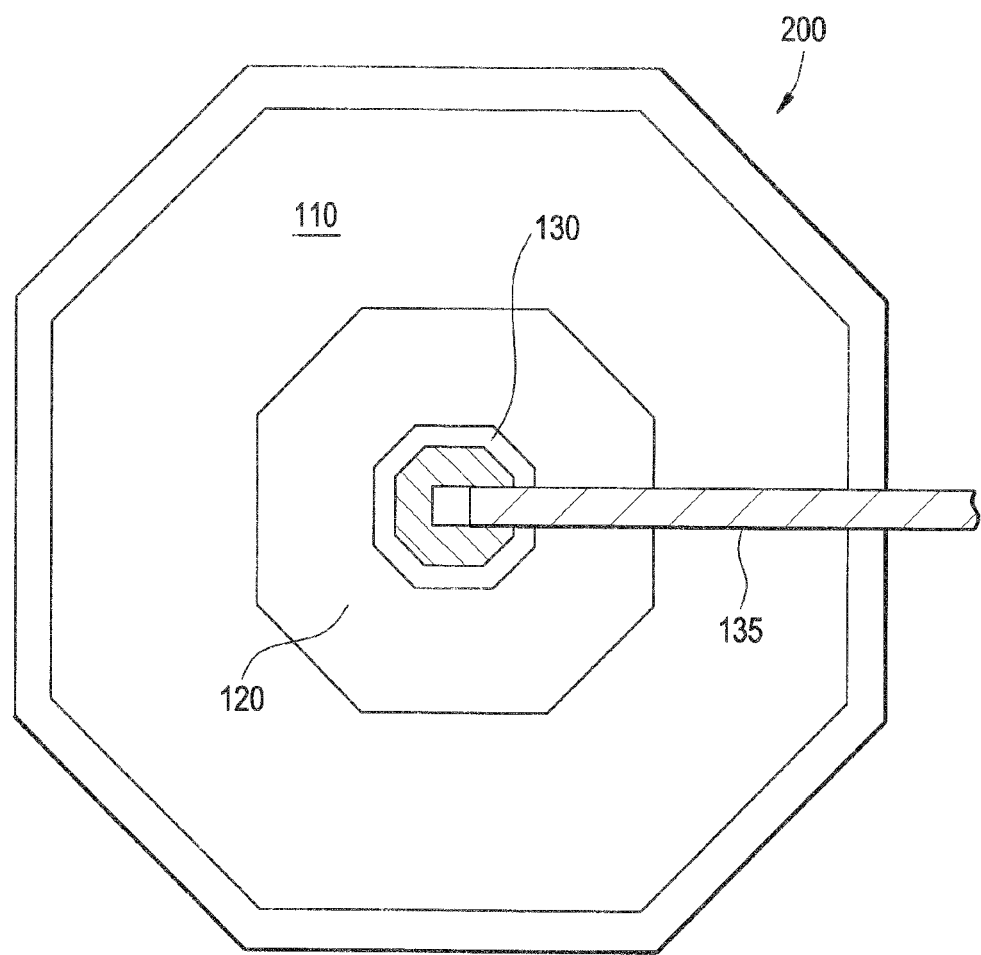
FIG. 2 illustrates a plan or layout view of a photodiode and a ring transfer gate, in accordance with embodiments of the present invention.

FIG. 2 illustrates a plan or layout view of a photodiode and a ring transfer gate 200, in accordance with embodiments of the present invention. FIG. 2 is not to scale, so as to better illustrate selected features of structure 200. Structure 200 generally corresponds to photo diode 110, transfer gate transistor 120 and floating diffusion 130 as highlighted in the circled portion of schematic 100 of FIG. 1.

In accordance with embodiments of the present invention, a floating diffusion 130 is surrounded by a transfer gate transistor 120. Floating diffusion 130 and transfer gate transistor 120 are in turn surrounded by a photo diode 110. Floating diffusion 130, transfer gate transistor 120 and photo diode 110 are illustrated as regular octagons. However, embodiments in accordance with the present invention are well suited to other shapes, including, for example, circles, approximations of circles, rectangles and other regular and irregular polygons. It is also not required that floating diffusion 130, transfer gate transistor 120 and photo diode 110 have the same center, in accordance with embodiments of the present invention.

In accordance with embodiments of the present invention, the performance of structure 200 may benefit from locating floating diffusion 130 and transfer gate transistor 120 off center, e.g., to the right in the view of FIG. 2, in order to shorten trace 135 from floating diffusion 130 to source follower amplifier 150. For example, the capacitance of trace 135 contributes to the total floating diffusion capacitance 130 setting the conversion gain from charge to voltage, when reading the pixel. Reducing the capacitance of trace 135 may optimize the signal to noise ratio when reading from floating diffusion 130.

Figure 3:
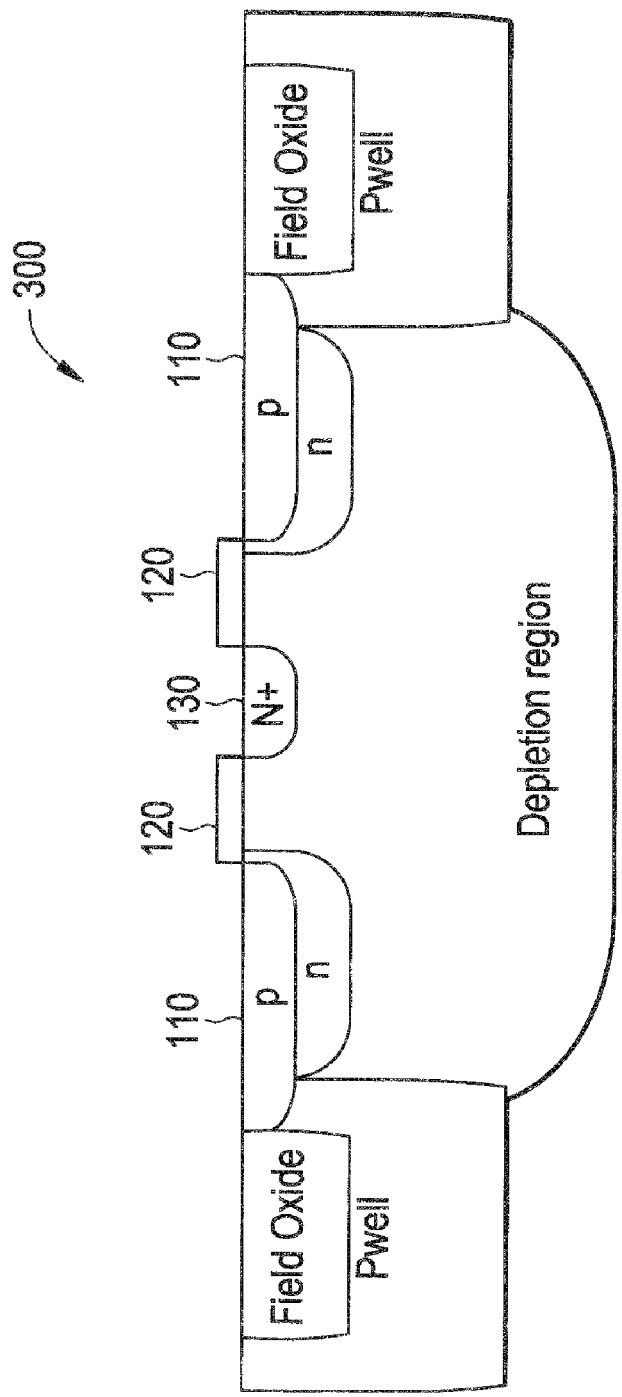
FIG. 3 illustrates a side sectional view of a photodiode and a ring transfer gate, in accordance with embodiments of the present invention.

FIG. 3 illustrates a side sectional view of a photodiode and a ring transfer gate 300, in accordance with embodiments of the present invention. FIG. 3 is not to scale, so as to better illustrate selected features of structure 300. Structure 300 generally corresponds to photo diode 110, transfer gate transistor 120 and floating diffusion 130 as illustrated in FIG. 2 and as highlighted in the circled portion of schematic 100 of FIG. 1.

Structure 300 comprises a floating diffusion 130 surrounded by a transfer gate transistor 120. Transfer gate 120 is in turn surrounded by photo diode 110. It is appreciated that structure 300 does not have shallow trench isolation (STI) features.

Transfer gate transistor 120 may be a "ring" or "annular" type of transistor. In general, a ring-type transistor is a type of enclosed geometry MOSFET in which an inner portion, usually configured as a drain of the device, is surrounded by a channel region under a gate, which in turn is surrounded by an outer active portion, e.g., a source. Another type of enclosed geometry MOSFET is known as a "waffle" layout.

Design of, and design with such enclosed geometry MOSFETs, e.g., ring transistors, has been generally discouraged as such devices are generally not accurately modeled by existing design tools, e.g., circuit simulators. Embodiments of enclosed geometry MOSFETs have difficulty in obtaining width to length, or "W/L," ratios of less than about two to one. It is appreciated that the W/L ratio is a standard design parameter used for the design, layout and modeling of MOSFETs. In any event, the W/L ratio is poorly defined for such enclosed device structures, adding additional complications and uncertainties in design. Further, enclosed geometry MOSFETs generally consume more semiconductor die area than non-enclosed MOSFETs.

In an embodiment, the absence of STI in the transfer gate transistor maintains a low leakage property even after exposure to radiation. A typical leakage path after exposure to radiation is along the sides of a MOSFET. For example, in regions where active poly silicon comes in contact with STI, such edges underneath a gate are a typical source of leakage. Another leakage path comprises floating diffusion under STI leaking to any other N+ region, e.g., source or drain region of neighboring MOSFETs.

The ring transfer gate transistor with the pinned photo diode around it and the floating diffusion on the inside may produce a radiation tolerant 4T pixel with low dark current.

In addition, location of the transfer gate within, e.g., surrounded by, the photo diode may increase the speed of operation of transferring the charge collected by the photo diode to the floating diffusion. In this manner, the image sensing circuit may be able to operate faster Further, a transfer gate surrounded by a photo diode and surrounding a storage element, e.g., a floating diffusion, may increase the efficiency or completeness of charge transfer. For example, transfer gates may transfer a greater percentage of charge collected by the photo diode to a floating diffusion. In this manner, embodiments in accordance with the present invention may enable higher speed operation, e.g., faster "exposure" times and/or increased frame rates, and low light performance, in addition to increased radiation hardness.

Figure 4:
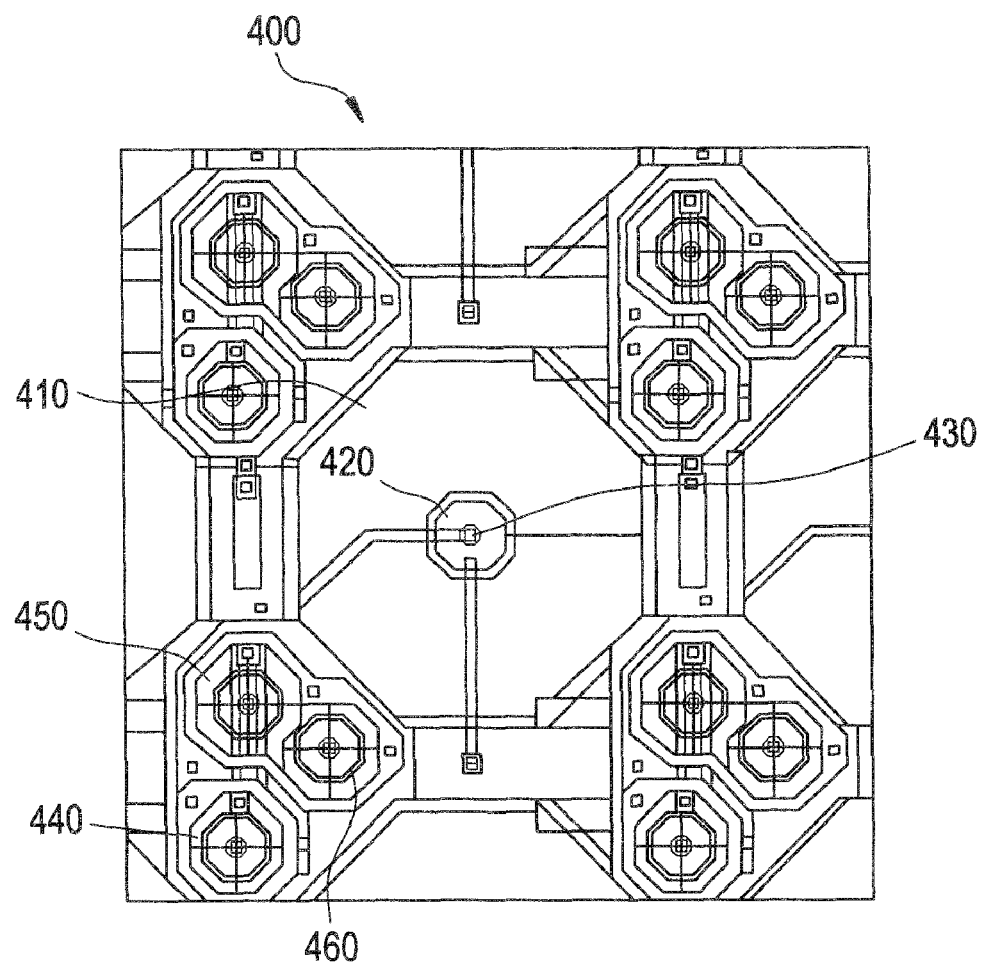
FIG. 4 illustrates a layout of a pixel image, in accordance with embodiments of the present invention.

FIG. 4 illustrates an exemplary layout 400 of a pixel image sensor, in accordance with embodiments of the present invention. FIG. 4 is not to scale, so as to better illustrate selected features of structure 400. Pixel image sensor 400 comprises a floating diffusion 430, surrounded by a ring transfer gate 420, which are in turn surrounded by a photo diode 410. These features generally correspond to floating diffusion 130, ring transfer gate 120 and photo diode 110, as described in FIG. 2.

Pixel image sensor 400 further comprises three additional transistors in order to form a "4T" pixel, as shown by the schematic 100 in FIG. 1. Pixel image sensor 400 further comprises a source follower amplifier transistor 450, a select transistor 440 and a reset transistor 460. These features generally correspond to source follower amplifier transistor 150, a select transistor 140 and reset transistor 160 as described in FIG. 1. Source follower amplifier transistor 450, select transistor 440 and reset transistor 460 are illustrated as "circular" transistors. In general, circular transistors decrease leakage current. Such circular, or "approximately circular" transistors further go well with the generally circular layout of photo diode 110. It is to be appreciated that embodiments in accordance with the present invention are well suited to other transistor shapes as well.

Figure 5:
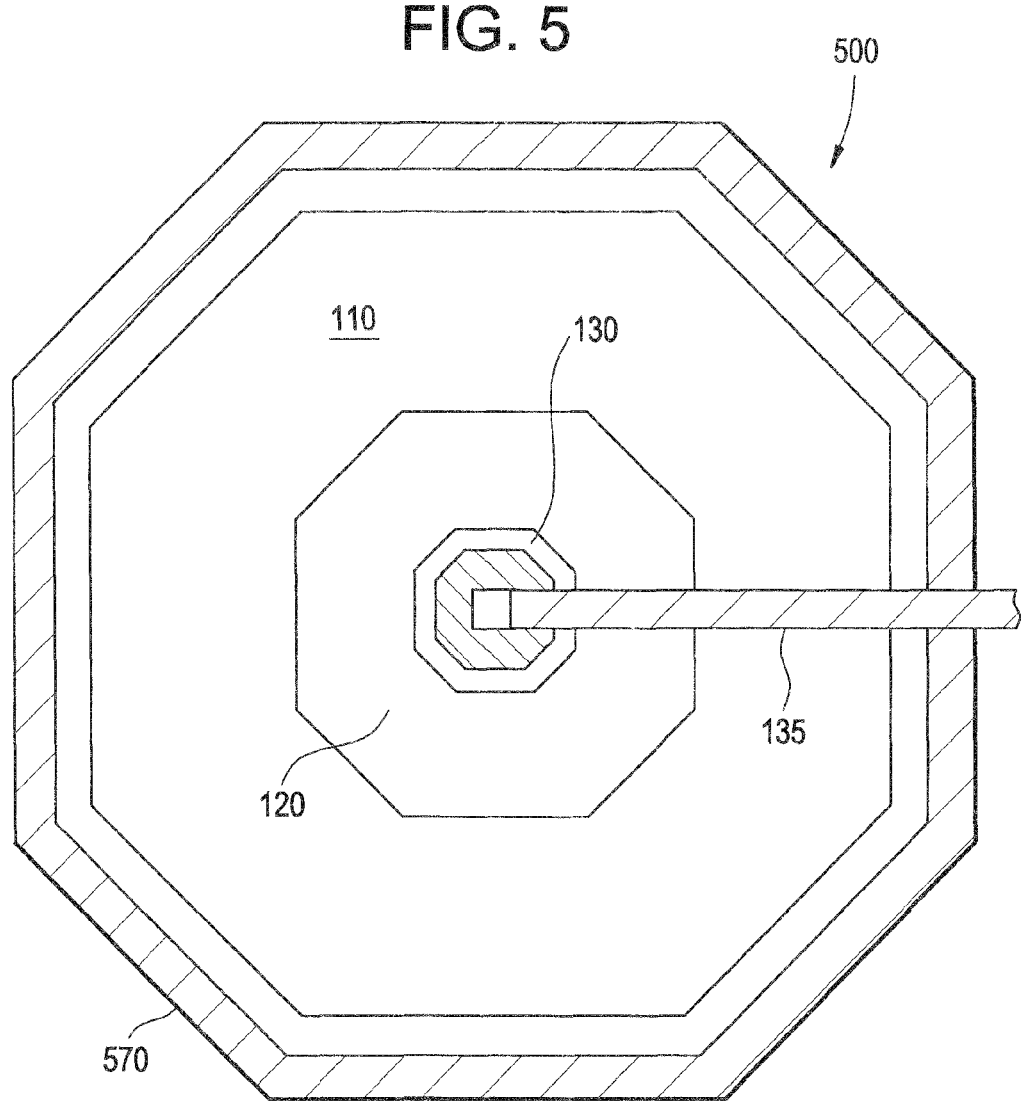
FIG. 5 illustrates a plan or layout view of a photodiode and a ring transfer gate, in accordance with embodiments of the present invention.

FIG. 5 illustrates a plan or layout view of a photodiode and a ring transfer gate 500, in accordance with embodiments of the present invention. FIG. 5 is not to scale, so as to better illustrate selected features of structure 500. Structure 500 generally corresponds to photo diode 110, transfer gate transistor 120 and floating diffusion 130 as highlighted in the circled portion of schematic 100 of FIG. 1 and as illustrated in FIG. 2.

In addition to those structured previously identified in FIG. 2, structure 500 comprises an additional poly silicon ring 570 surrounding the outside of the photo diode 110. The poly silicon ring 570 separates the photo diode 110 from STI structures, and may further reduce leakage from the photo diode 110. The poly silicon ring 570 does not function as a transfer gate or other transistor. Accordingly, the implants, e.g., species, energies and/or duration of implanting, can be optimized for low leakage instead of being optimized for transfer gate transistor characteristics.

Figure 6:
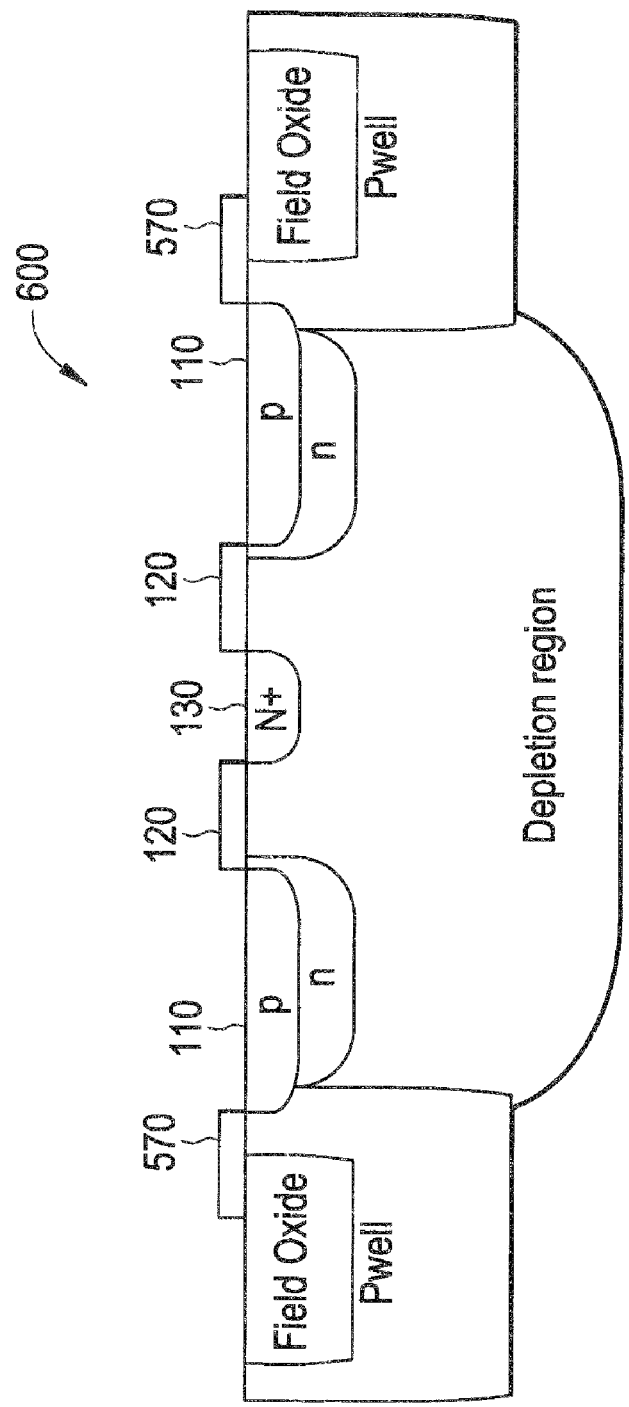
FIG. 6 illustrates a side sectional view of a photodiode and a ring transfer gate, in accordance with embodiments of the present invention.

FIG. 6 illustrates a side sectional view of a photodiode and a ring transfer gate 600, in accordance with embodiments of the present invention. FIG. 6 is not to scale, so as to better illustrate selected features of structure 600. Structure 600 generally corresponds to structure 500 (FIG. 5), and comprises the poly silicon ring 570 surrounding the outside of the photo diode 110.

As previously described with respect to FIGS. 2 and 3, the photo diode 110, transfer gate transistor 120 and floating diffusion 130, as well as poly silicon region 570, need not be circular or approximately circular. Rather, embodiments in accordance with the present invention are well suited to a variety of closed shapes. In general, poly silicon region 570 should contact photo diode 110.

Embodiments in accordance with the present invention include low leakage pinned photodiodes using ring transfer gates. In addition, systems and methods of image sensors with photo diodes surrounding transfer gates are disclosed in embodiments herein. Embodiments described herein may be compatible and complimentary with existing systems and methods of semiconductor image sensor manufacturing and operation.

Various embodiments of the invention are thus described. While the present invention has been described in particular embodiments, it should be appreciated that the invention should not be construed as limited by such embodiment.

What is claimed is:

1. A pixel sensing circuit comprising:
   a photo diode;
   a charge storage element functionally coupled to and surrounded by said photo diode;
   a transfer gate transistor configured to couple the charge storage element to the photo diode; and
   a poly silicon structure surrounding said transfer gate transistor.

2. The pixel sensing circuit of claim 1 wherein said charge storage element comprises a floating diffusion.

3. The pixel sensing circuit of claim 2 wherein said transfer gate transistor comprises said floating diffusion.

4. The pixel sensing circuit of claim 3 wherein said floating diffusion is surrounded by said transfer gate transistor, and said transfer gate transistor is surrounded by said photo diode.

5. The pixel sensing circuit of claim 4 wherein said transfer gate transistor comprises an enclosed geometry MOSFET.

6. The pixel sensing circuit of claim 5 wherein said transfer gate transistor comprises a ring transistor structure.

7. The pixel sensing circuit of claim 1 further comprising a source follower transistor functionally coupled to said charge storage element.

8. The pixel sensing circuit of claim 1 further comprising a reset transistor functionally coupled to said charge storage element.

9. A pixel sensing circuit comprising:
   a photo diode;
   a transfer gate transistor functionally coupled to and surrounded by said photo diode;
   a charge storage element functionally coupled to and surrounded by said photo diode; and
   a select transistor functionally coupled to said charge storage element for selecting an output of said pixel sensing circuit onto a column line, wherein said column line is coupled to at least one other substantially similar pixel sensing circuit.

10. The pixel sensing circuit of claim 9 wherein said transfer gate transistor comprises an enclosed geometry MOSFET.

11. The pixel sensing circuit of claim 10 wherein said transfer gate transistor comprises a ring transistor structure.

12. The pixel sensing circuit of claim 9 wherein said transfer gate transistor has about the same center as said photo diode.

13. The pixel sensing circuit of claim 9 wherein said photo diode is of a shape of a regular or irregular polygon of at least three sides.

14. A pixel sensing circuit comprising:
   a transfer gate transistor,
   a poly silicon structure surrounding said transfer gate transistor; and
   a floating diffusion functionally coupled to and surrounded by said transfer gate transistor.

15. The pixel sensing circuit of claim 14 wherein said transfer gate transistor has substantially the same center as said floating diffusion.

16. The pixel sensing circuit of claim 14 wherein said transfer gate transistor comprises a complementary metal oxide semiconductor (CMOS) ring transistor structure.

17. The pixel sensing circuit of claim 14 wherein said floating diffusion and said transfer gate transistor comprise different shapes.

18. The pixel sensing circuit of claim 14 wherein:
said floating diffusion is surrounded by said transfer gate transistor;
said transfer gate transistor is surrounded by a photo diode;
said photo diode is functionally coupled to said transfer gate transistor; and
said photo diode is surrounded by said poly silicon structure.

* * * * *